US006417515B1

United States Patent
Barrett et al.

(10) Patent No.: US 6,417,515 B1
(45) Date of Patent: Jul. 9, 2002

(54) IN-SITU ION IMPLANT ACTIVATION AND MEASUREMENT APPARATUS

(75) Inventors: Howard T. Barrett, Starksboro; John J. Ellis-Monaghan, Grand Isle; Toshiharu Furukawa, Essex Junction; James A. Slinkman, Montpelier, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/527,192

(22) Filed: Mar. 17, 2000

(51) Int. Cl.[7] ............................................. H01J 37/317
(52) U.S. Cl. .............................. 250/492.21; 250/492.2; 250/492.1; 250/441.11; 250/309
(58) Field of Search ........................ 250/492.21, 492.2, 250/492.1, 309, 441.11

(56) References Cited

U.S. PATENT DOCUMENTS

| 4,151,008 A | 4/1979 | Kirkpatrick | 148/1.5 |
|---|---|---|---|
| 4,257,825 A | 3/1981 | Schaumburg | 148/1.5 |
| 4,379,727 A | 4/1983 | Hansen et al. | 148/1.5 |
| 4,621,411 A | 11/1986 | Habemann et al. | 29/571 |
| 4,868,490 A | 9/1989 | Blumenthal | 324/64 |
| 5,184,398 A | 2/1993 | Moslehi | 29/825 |
| 5,400,209 A | 3/1995 | Moslehi | 361/234 |
| 5,451,529 A | 9/1995 | Hsu et al. | 437/8 |
| 5,454,347 A | 10/1995 | Shibata et al. | 117/202 |
| 5,474,940 A | 12/1995 | Tsukamoto | 437/19 |
| 5,528,048 A * | 6/1996 | Oae et al. | 250/492.22 |
| 5,569,624 A | 10/1996 | Weiner | 437/200 |
| 5,629,528 A * | 5/1997 | Jost et al. | 250/492.21 |
| 5,688,715 A | 11/1997 | Sexton et al. | 437/173 |
| 6,049,220 A * | 4/2000 | Borden et al. | 324/765 |

FOREIGN PATENT DOCUMENTS

| JP | 53-072453 | 6/1978 |
|---|---|---|
| JP | 58-116729 | 7/1983 |
| JP | 62-204167 | 9/1987 |
| JP | 62-204168 | 9/1987 |

* cited by examiner

*Primary Examiner*—Bruce Anderson
*Assistant Examiner*—Nikita Wells
(74) *Attorney, Agent, or Firm*—Mark F. Chadurjian; James M. Leas

(57) ABSTRACT

A substrate, such as a semiconductor chip or wafer, is implanted along with product wafers in an ion implant vacuum system. The substrate is then annealed in an annealing step that is accomplished while the substrate is within the vacuum system. The annealer is a rapid thermal annealer, such as a laser annealer or a flash lamp annealer. The annealing step does not affect the product wafers. Then a measurement is performed on the implanted and annealed substrate while it is within the vacuum system that can be suitably correlated with implant dose. The measurement can be with a technique such as a four point probe or with a tool that measures optical reflectivity from a surface of the implanted substrate. An additional implant can then be provided to product wafers if necessary to come closer to the desired dose.

11 Claims, 6 Drawing Sheets

IN-SITU ION IMPLANT ACTIVATION AND MEASUREMENT APPARATUS

FIELD OF THE INVENTION

This invention generally relates to ion implantation. More particularly, it relates to apparatus for accurately measuring the dose implanted into targets. Even more particularly, it relates to an improved apparatus for activating, measuring, and controlling the dose implanted.

BACKGROUND OF THE INVENTION

Ion implant dose is presently controlled by counting ions with an electrical counter, such as a Faraday cup, which is correlated to sheet resistance, spreading resistance, or SIMS measurements made on monitor wafers. Monitor wafers are run periodically to verify the calibration and to measure implant tool consistency. These monitor wafers are annealed along with product wafers after the implant process is complete. Sheet resistance and other measurements are then made on the monitor wafers. However, the correlation between ion count and dose has not been adequate since some ions are neutralized during their flight and some ions bounce out of the cup and therefore are not detected by a Faraday cup. Furthermore, the correlation measurement with the monitor wafers is accomplished well after product wafers from that batch have completed ion implant processing. Thus, a better solution for ion implant measurement is needed that is more accurate and that eliminates delay between implant and measurement.

SUMMARY OF THE INVENTION

It is therefore an object of the present invention to improve the in-situ measurement of dose.

It is a further object of the present invention to provide a way to activate the dose implanted in a substrate while the substrate is still in the ion implant tool.

It is a further object of the present invention to provide a way to measure the dose implanted in a substrate while the substrate is still in the ion implant tool and while corrections to the implant can still be accomplished.

It is a feature of the present invention that the substrate is implanted with a dose of a dopant and the substrate is then annealed within the vacuum system of the implant tool.

It is a further feature of the present invention that the substrate is implanted with a dose of a dopant, annealed to activate the dopant, and then the annealed implant is measured, all within the vacuum system of the implant tool.

It is an advantage of the present invention that tighter control of implant dose is provided.

These and other objects of the invention are accomplished by a method of processing a semiconductor substrate comprising the steps of implanting the substrate with a dose of a dopant in a vacuum system and activating said dopant while said substrate is within said vacuum system. The dose can then be measured within the vacuum system.

Another aspect of the invention is an ion implant system, comprising a vacuum chamber comprising an ion implanter for implanting a semiconductor substrate ith a dopant, said vacuum chamber further comprising an annealer for activating said dopant. The vacuum chamber can also have a measuring system for measuring a parameter related to the dose of dopant implanted. A semiconductor substrate can be implanted, annealed, and measured while remaining in the vacuum system.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present inventors recognized that present methods of measuring ion implant dose are not particularly accurate and results are not available soon enough to control the ion implant tool in real time. Implant dose varies because of vacuum and Faraday cup variations. Vacuum variation arise from out gassing of photoresist that may be on substrates during implant. The substrate is typically a semiconductor wafer. The out gassing can raise chamber pressure, neutralizing some of the ions in the beam, and this effect can vary from run to run. The Faraday cup measures only the ion portion of the implant beam. Error is introduced as the number of neutralized particles varies and as the number of ions that bounce out of the Faraday cup varies.

This invention improves measurement accuracy and reduces delay in getting the measurement. It provides for vastly improved control over the implant process. In the invention, a monitor wafer is implanted along with product wafers in the ion implant tool. The monitor wafer is then moved within the vacuum system to a rapid thermal anneal and measurement station. The monitor wafer is then annealed in a rapid annealing step that can be accomplished within the implant tool vacuum system within a few seconds. A laser anneal or a flash lamp rapid thermal anneal can be used. This anneal does not effect product chips on product wafers that remain in the implant chamber. Then a measurement is performed on the implanted and annealed monitor wafer within the implant tool vacuum system that can be suitably correlated with implant dose.

The measurement can be performed with a device such as a four point probe or with a tool that measures optical reflectivity from a surface of the implanted substrate. Reflectivity of infrared light increases quickly with the number of mobile carriers. The number of mobile carriers is related to the dose implanted.

If the dose implanted is found to be less than desired, the additional dose needed is calculated. Then product wafers and monitor wafers remaining in the implant chamber are implanted with an additional ion implant dose to provide a total dose closer to the desired dose. The anneal and measuring steps can be repeated on a second portion of the monitor wafer or on a second monitor wafer for further refinement.

Figure 1:
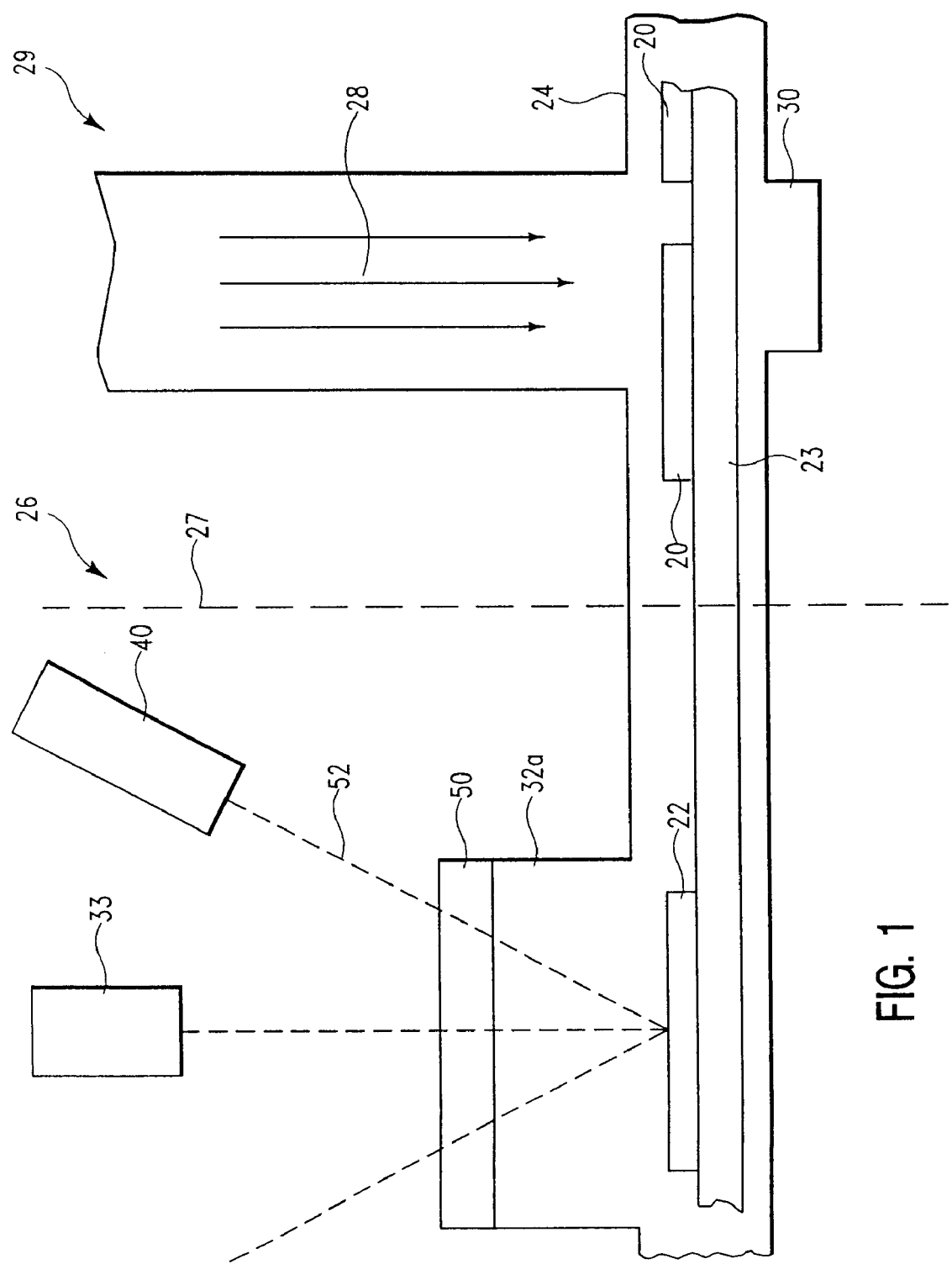
FIG. 1 is a top view of an ion implant system of the present invention showing an implanter and an anneal and measurement station having a laser anneal and a laser reflectance measurement unit.
Figure 2A:
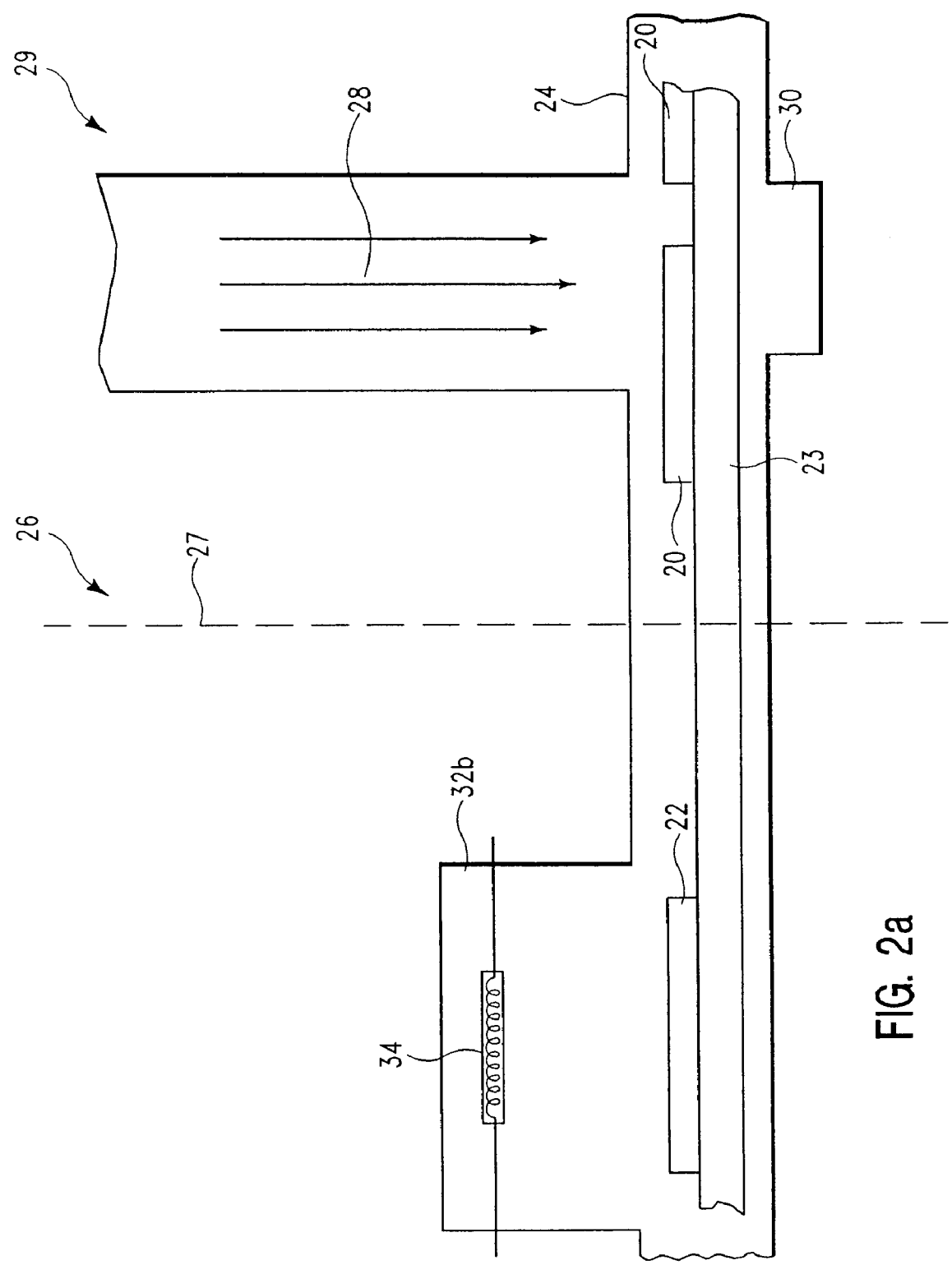
FIG. 2a is a top view of an ion implant system of the present invention with an alternate embodiment of the anneal and measurement station having a flash lamp anneal.
Figure 2B:
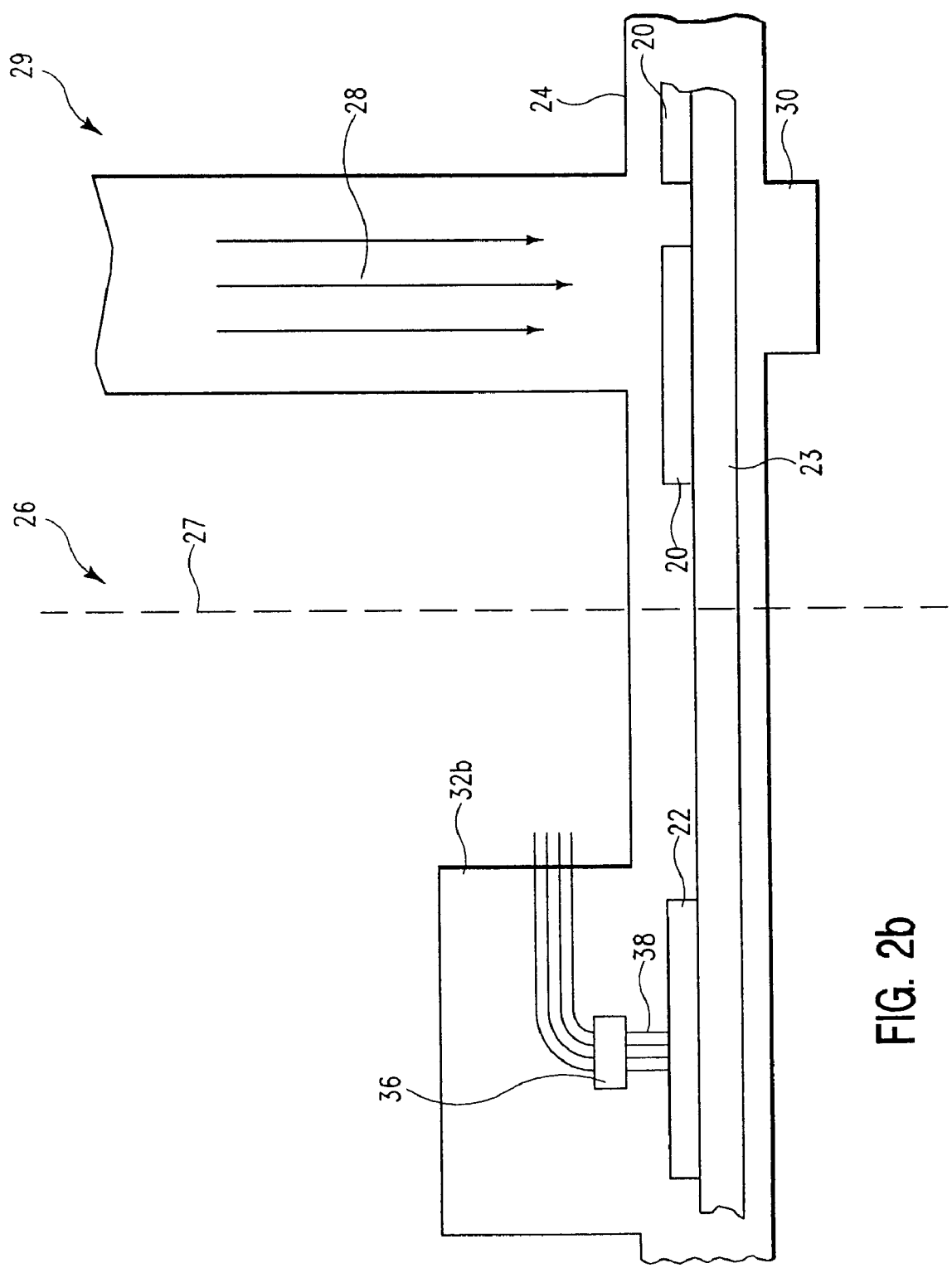
FIG. 2b is a top view of the implant system of FIG. 2a showing a portion of the anneal and measurement station having a four point probe measurement unit.

In the process, product wafers 20 and monitor wafers 22 are loaded on disk 23 in vacuum chamber 24 of ion implant tool 26, as shown in the top view of FIGS. 1, 2a 2b and in step 101 of the flow chart of FIG. 2. Typically at least about twelve product wafers 20 and at least one monitor wafer 22 are loaded for implant in each ion implant run. Disk 23 holds product wafer 20 and monitor wafer 22 and rotates about horizontal axis 27 at about 800 rpm. While rotating disk 23 oscillates up and down so that horizontal beam of ions 28 from ion implanter 29 provides a uniform dose of dopant across the entire surface of disk 27 and provides a uniform dose of dopant to wafers 20, 22. The up and down motion of disk 27 is varied in speed to provide this uniform dose, as is well known in the art.

An initial dose of a specified ion species is implanted at a desired ion energy, as shown in step 102, into product wafers 20 and monitor wafer 22. During implant this initial dose can be measured with standard Faraday cup 30. Faraday cup 30 is positioned within implant chamber 24 under disk 23. A slit in disk 23 provides a dose to Faraday cup 30 equivalent to what it would get if it were rotating on disk 23. The ion implantation is stopped when the approximately desired dose has been achieved, as measured by Faraday cup 30, as shown in step 103. Alternatively, implantation may be stopped after a specified implant time.

After the initial implant is complete, disk 23 stops spinning and monitor wafer 22 is rotated into position under anneal and implant station 32a, 32b, as shown in FIGS. 1a, 1b and in step 104. Preferably monitor wafer 22 is devoid of films or has only very thin films, so that the entire dose shined on monitor wafer 22, including all ions and neutralized ions are implanted into semiconductor material of monitor wafer 22 rather than into such covering films. Thus, monitor wafer 22 has the full dose of the implanted species located in semiconductor where it can most easily be measured after anneal by a technique such as four-point probe electrical measurement or optical reflectivity.

Monitor wafer 22 is then annealed in anneal and measurement station 32a, 32b with a rapid thermal anneal process, as shown in step 105. A laser, such as XeCl laser 33 can be used for this anneal step, as is well known in the art. Alternatively, monitor wafer 22 can be annealed with flash lamp 34 or an array of flash lamps as shown in FIG. 1b. If laser 33 or flash lamp 34 is located outside vacuum chamber 24, transparent window 50 (FIG. 1a) will be used. Other rapid annealers, such as an electron beam, can also be used. In the rapid anneal step monitor wafer 22 is heated to a temperature of at least 700 C. for a time of about 30 seconds to anneal implant damage and electrically activate the implanted dose. Anneal time can vary from a fraction of a second to about 1 minute, depending on the temperature reached. Only a portion of wafer 22 need be annealed that is large enough for the measurement in the following step. None of product wafers 20 are exposed to the anneal during this anneal of monitor wafer 22.

In the next step, a parameter of the monitor wafer is measured in anneal and measurement station 32a, 32b that is related to the implanted dose, as shown in step 106. The parameter can be sheet resistance which can be measured with a standard four point probe 36, as shown in FIG 1c. Disk 23 is rotated to move monitor wafer 32 away from lamp 34 and under four point probe 36 that is included in anneal and measurement station 32b at the same distance from axis 27 as lamp 34 but separated from lamp 34. Probes 38 of four point probe 36 are lowered for the measurement using a motor integrated with the probe (not shown).

Figure 3:
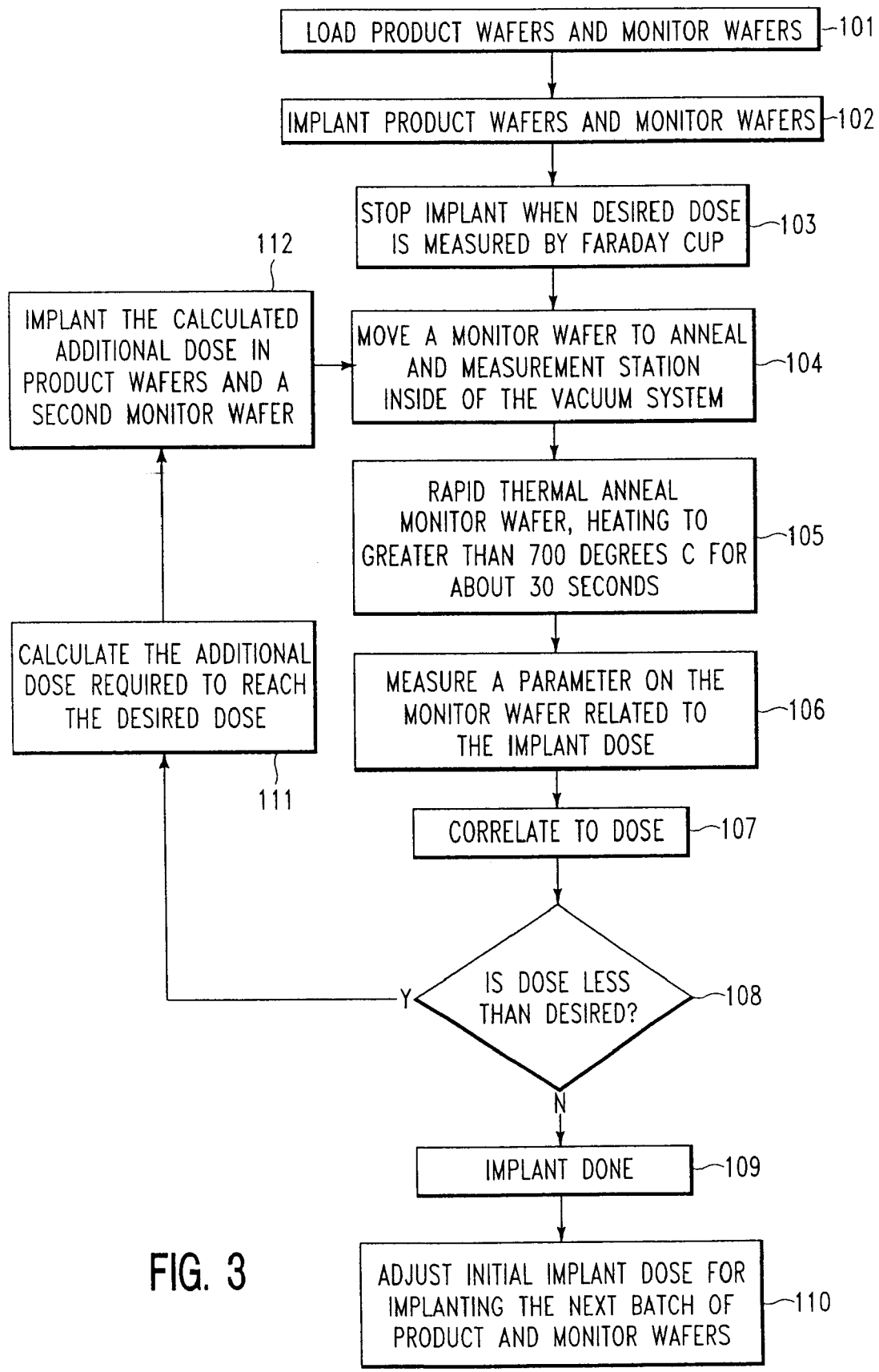
FIG. 3 is a flow chart showing the process steps of the present invention.

Active carrier concentration can also be measured optically, for example by measuring optical reflectance, as shown in FIG. 3 and more fully described below.

The measurement of step 106 is then correlated to the dose implanted, as shown in step 107. Of course, the measurement system is independent of the annealer. For example, four point probe 36 can be used with the laser annealer and the reflectance measurement technique can be used with lamp annealer 34.

Next, a decision is made as to whether the dose implanted is less than desired, as shown in step 108. If the dose implanted is equal to or greater than the desired dose then implant is complete, as shown in step 109. Implanted product wafers 20 are unloaded from vacuum chamber 24 and the next batch of wafers is loaded.

If the initial dose implanted is less than the desired dose then an additional dose can be implanted in product wafers 20 to provide them with a dose more nearly equal to that desired. Several additional steps may be performed to accomplish this.

First using the measurement of monitor wafer 22 of step 106 and the correlation to dose of step 107, the amount of additional dose needed to provide the desired dose in product wafers 20 is calculated, as shown in step 111. That additional dose is then implanted into product wafers 20 and into second monitor wafer 22, as shown in step 112. Second monitor wafer 22 is now rotated into anneal and measurement chamber 32a, 32b, as shown in step 104. Annealing step 105, measuring step 106, and correlating step 107 are then repeated for second monitor wafer 22 to determine whether the second monitor wafer now has the desired dose in step 108. If it does then implant is complete as shown in step 109. The initial implant time or dose rate can now be adjusted for the next batch of product and monitor wafers loaded into implant chamber 24 to provide the additional dose in the first step, as shown in step 113.

In an alternative embodiment no second monitor wafer is needed. Results of the measurement of the first monitor are used to calculate the additional dose required, as shown in step 110 and that dose is implanted in the product wafers. But no further anneal and measurement of a monitor wafer is performed. This single additional implant step is expected to improve implant dose control substantially.

In yet another alternative, a small part of a product wafer or monitor wafer can be used for the monitoring function. In this case a laser anneal is performed on a small spot on a product wafer separate from active chips or on a small part of a monitor wafer. That spot is then measured and additional dose calculated from that measurement. Care must be taken with this process to avoid annealing nearby chips on the product wafer and to avoid damaging films, such as photoresist, dielectric films, metal films, etc. on the product wafer used for the anneal. A high energy narrow beam laser can be used for this step, as is well known in the art. In addition, if a product wafer is used, account must be taken of the portion of the implant dose that may locate in films overlying the semiconductor surface. A bare monitor wafer avoids dose being lost into overlying films, so the entire implanted dose is counted. If only a portion of the product wafer or monitor wafer is annealed with the laser, additional dose of implant can then be provided and the wafer can be annealed and measured again in another location.

Monitor wafer 22 can be the same size as product wafer 20 and made of the same semiconductor material. However, monitor wafer 22 can also be much smaller than product wafer 20, taking up less space in vacuum chamber 24, and leaving more space for additional product wafers 20. For example, monitor wafer 22 can be a chip cut from a wafer or a small diameter wafer.

The anneal step provided for dose control after an implant step need not be the same as the anneal process later used on product wafers. Thus, a laser, such as a xenon chloride laser, can be used for the monitor wafer dose evaluation while the product wafers see an array of flash lamps or even a furnace anneal after they are removed from ion implant tool 26.

The laser reflectance method involves shining light from far infrared laser 40 having a wavelength in the range of 1 to 100 μm on monitor wafer 22 through half silvered mirror 42, as shown in FIG. 3. Measures of incident and reflected light are obtained with bolometers 44, 46 which receive light reflected from half silvered mirror 42 and from monitor wafer 22 respectively.

Rotating chopper 48 can be used in the path of incident laser beam 49 to further improve accuracy by providing improved correlation between incident and reflected beam intensity. Chopper 48 allows for a differential reflectance measurement as is well known in the art of spectroscopy.

Laser 40 used for the reflectance measurement may be shined through window 50 into anneal and measurement station 32a, and onto monitor wafer 22 which is located on disk 23 held at a potential Vc to force the wafer into accumulation during the measurement. Disk 23 is typically formed of aluminum. Light reflected from wafer 22 passes back through IR transparent window 50 to bolometer 46. Incident beam 49 has a spot size on the order of 1 to 5 mm in diameter. Incident beam 49 from laser 40 is directed at monitor wafer 22 at an angle from 0 to 30° to normal 54 so beam 56 that is reflected from half silvered mirror 42 emerges spaced from incident beam 49 and so beam 58 reflected from monitor wafer 22 misses mirror 42.

Preferably, anneal and measurement station 32a is located across axis of rotation 27 of disk 23 from ion beam 28 (FIG. 1). During the measurement half silvered mirror 42 is positioned a distance h above monitor wafer 22 so that mirror 42 is out of the way of reflected beam 58. In addition, to minimize interference effects half silvered mirror 42 should be at least 10 wavelengths above the surface of monitor wafer 22. In addition bolometers 44 and 46 are located at distances $L_i$ and $L_r$ respectively from window 50, close enough to ensure that substantially all light reflected from mirror 42 and wafer 32 is collected.

Figure 4:
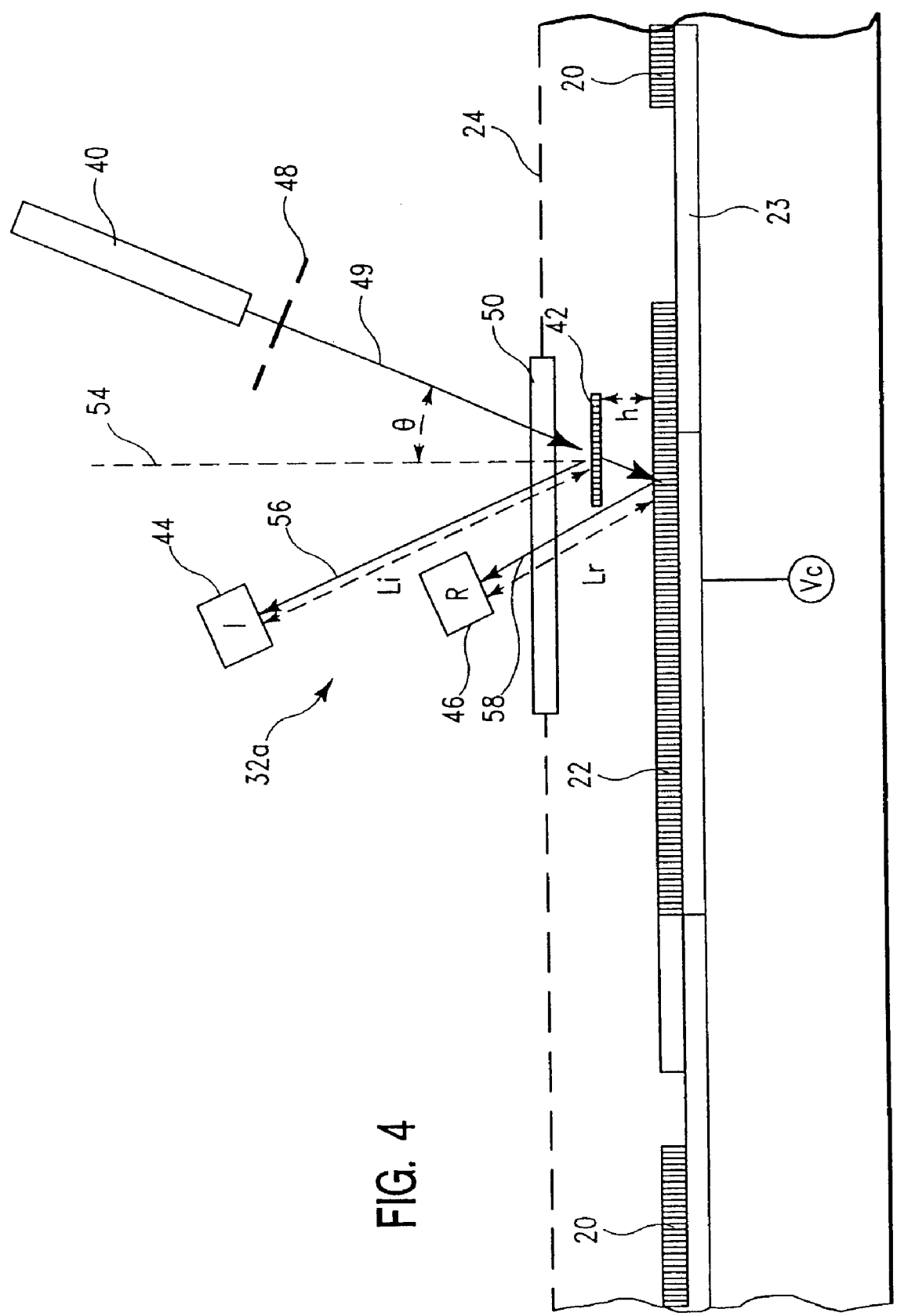
FIG. 4 is a schematic diagram illustrating how reflectance is measured.
Figure 5:
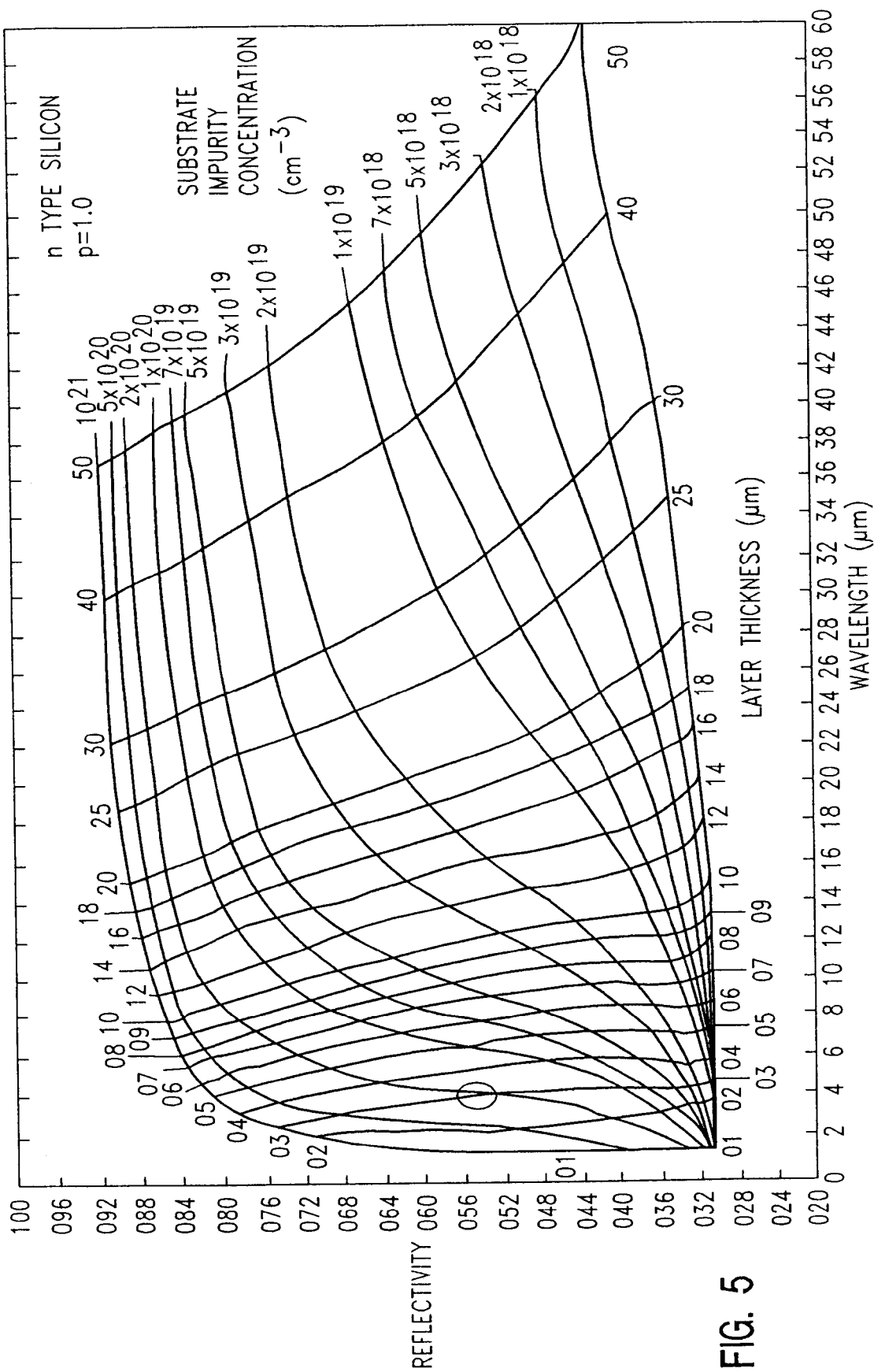
FIG. 5 is a graph showing the reationship between dose and reflectance as a function of layer thickness and wavelength.

Reflectance is correlated with dose implanted as a function of dielectric layer thickness and laser wavelength, as shown in FIG. 4. It is seen that reflectance increases with dose. The data in this chart can be provided as a lookup table in a computer memory, and dose can then be automatically determined from the reflectance measurement since film thickness and laser wavelength are known. Response curves in FIG. 4 depend on the angle of incidence and this angle can be adjusted to obtain the best response while providing for separately receiving incident and reflected beams at bolometers 44 and 46.

While several embodiments of the invention, together with modifications thereof, have been described in detail herein and illustrated in the accompanying drawings, it will be evident that various further modifications are possible without departing from the scope of the invention. For example, bolometers 44, 46 can be inside vacuum chamber 24. Nothing in the above specification is intended to limit the invention more narrowly than the appended claims. The examples given are intended only to be illustrative rather than exclusive.

What is claimed is:

1. An ion implant system, comprising a single vacuum chamber comprising a first station for implanting a dopant into a semiconductor substrate, and a second station comprising an annealer for activating said dopant, so that said dopant may be implanted and annealed without breaking vacuum.

2. The system of claim 1, wherein said annealer is a rapid thermal annealer.

3. The system of claim 2, wherein said rapid thermal annealer comprises a laser or a flash lamp.

4. The system of claim 1, wherein said vacuum chamber further comprises a measuring system for measuring a parameter related to dose of dopant implanted.

5. The system of claim 4, wherein said measuring system comprises a four point probe.

6. The system of claim 4, wherein said measuring system comprises a reflectance measurement apparatus.

7. The system of claim 6, wherein said reflectance measurement apparatus comprises an infrared laser.

8. The system of claim 6, wherein said reflectance measurement apparatus comprises a half silvered mirror.

9. The system of claim 1, wherein said vacuum chamber comprises a rotatable disk.

10. The system of claim 9, wherein said disk is rotatable to move a wafer to be measured from an annealer to a measuring system.

11. The system of claim 1, wherein said vacuum chamber comprises a window for an annealing beam or for a measuring beam.

* * * * *